United States Patent
Tsuchitani

(10) Patent No.: US 10,872,958 B2
(45) Date of Patent: Dec. 22, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Masanobu Tsuchitani, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/540,108

(22) Filed: Aug. 14, 2019

(65) Prior Publication Data
US 2020/0295145 A1    Sep. 17, 2020

(30) Foreign Application Priority Data

Mar. 11, 2019   (JP) .................................. 2019/043941

(51) Int. Cl.
*H01L 27/22*    (2006.01)
*H01L 21/00*    (2006.01)
(Continued)

(52) U.S. Cl.
CPC ........ *H01L 29/405* (2013.01); *H01L 29/7397* (2013.01)

(58) Field of Classification Search
CPC .................... H01L 45/1273; G01R 33/1246
(Continued)

(56) References Cited

U.S. PATENT DOCUMENTS 6,525,390 B2 *   2/2003   Tada .................... H01L 29/402
                                                    257/489
8,354,691 B2 *   1/2013   Tokura ................ H01L 29/1095
                                                    257/141

(Continued)

FOREIGN PATENT DOCUMENTS

JP       2016-225425 A    12/2016
JP          6344137 B2     6/2018

*Primary Examiner* — Calvin Lee
(74) *Attorney, Agent, or Firm* — Oblon, McClelland, Maier & Neustadt, L.L.P.

(57) ABSTRACT

A semiconductor device includes a semiconductor body, a first electrode on a back surface of the semiconductor body, second and third electrodes provided on a front surface of the semiconductor body, a first film linking the second electrode and the third electrode, and a second film between the semiconductor body and the first film. The first film has a higher resistivity than the first semiconductor body, and the second film is insulative. The second film includes a first-film-thickness portion and a second-film-thickness portion. The first-film-thickness portion has a first film thickness along a first direction directed from the first electrode toward the second electrode. The second-film-thickness portion has a second film thickness along the first direction thicker than the first film thickness. The first-film-thickness portion and the second-film-thickness portion surround the second electrode. The first film extends along surfaces of the first-film-thickness portion and the second-film-thickness portion.

11 Claims, 8 Drawing Sheets

(51) Int. Cl.
  *H01L 29/40* (2006.01)
  *H01L 29/739* (2006.01)
(58) Field of Classification Search
  USPC .............................. 438/59–63; 257/422–428
  See application file for complete search history.

(56) References Cited

U.S. PATENT DOCUMENTS 9,136,362 B2 * 9/2015 Sakai .................... H01L 21/765
9,773,878 B2   9/2017 Tanaka et al.

* cited by examiner

SEMICONDUCTOR DEVICE

CROSS-REFERENCE TO RELATED APPLICATIONS

This application is based upon and claims the benefit of priority from Japanese Patent Application No. 2019-043941, filed on Mar. 11, 2019; the entire contents of which are incorporated herein by reference.

FIELD

Embodiments relate to a semiconductor device.

BACKGROUND

In a semiconductor device such as a MOSFET, an IGBT, a diode, or the like, for example, a RFP (Resistive Field Plate) is used to increase breakdown voltage of the terminal region thereof. The RFP suppress the electric field concentration by enhancing the spreading of the depletion layer at the edge of the p-n junction positioned in the terminal region. Thus, it is possible to prevent edge breakdown of the p-n junction. However, the RFP has a characteristic such that the electrical resistance decreases due to the heat generated in the semiconductor device, and may increase the leakage current.

DETAILED DESCRIPTION

Figure 1A:
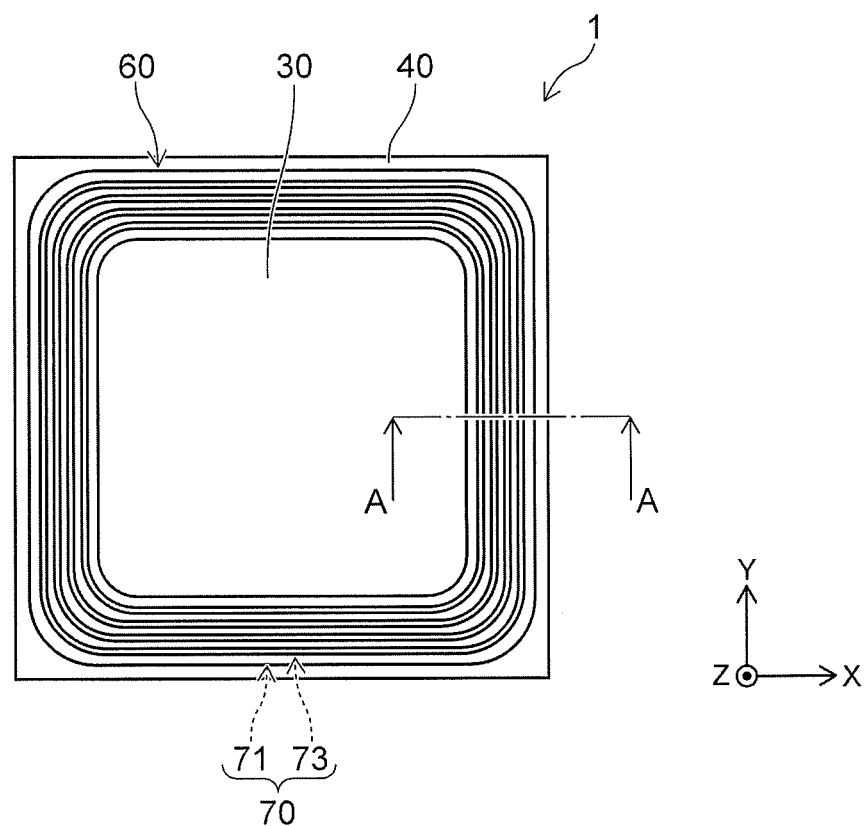
FIGS. 1A and 1B are schematic views showing a semiconductor device according to an embodiment.

According to one embodiment, a semiconductor device includes a semiconductor body, a first electrode provided on a back surface of the semiconductor body, a second electrode provided on a front surface of the semiconductor body, a third electrode provided on the front surface of the semiconductor body at a position spaced from the second electrode, a first film linking the second electrode and the third electrode; and a second film provided between the semiconductor body and the first film. The first film includes a material having a higher resistivity than a material of the first semiconductor layer, and the second film is insulative. The semiconductor body includes a first semiconductor layer of a first conductivity type, a second semiconductor layer of a second conductivity type and a third semiconductor layer of the first conductivity type. The second semiconductor layer is selectively provided between the second electrode and the first semiconductor layer. The third semiconductor layer is selectively provided between the third electrode and the first semiconductor layer. The third semiconductor layer includes first-conductivity-type impurities having a higher concentration than a concentration of first-conductivity-type impurities in the first semiconductor layer. The second film includes a first-film-thickness portion and a second-film-thickness portion. The first-film-thickness portion has a first film thickness along a first direction directed from the first electrode toward the second electrode. The second-film-thickness portion has a second film thickness along the first direction thicker than the first film thickness. The first-film-thickness portion and the second-film-thickness portion surround the second electrode. The first film extends along surfaces of the first-film-thickness portion and the second-film-thickness portion. The first film has a film thickness thinner than a thickness obtained by subtracting the first film thickness from the second film thickness.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
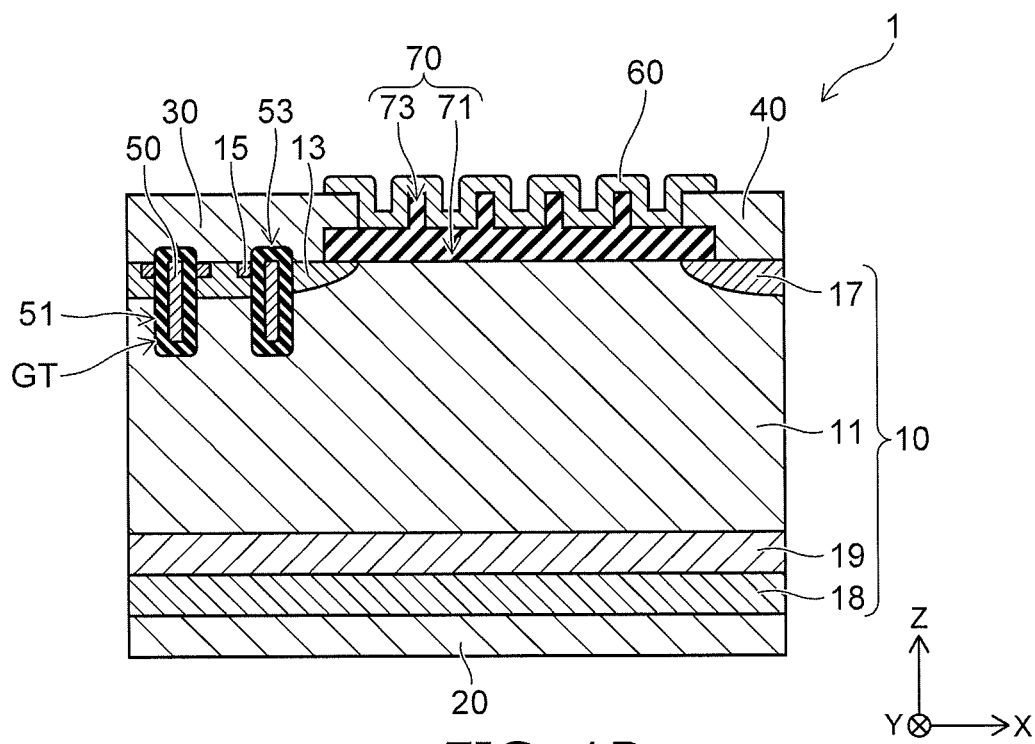

FIGS. 1A and 1B are schematic views showing a semiconductor device 1 according to an embodiment. FIG. 1A is a schematic plan view showing the top surface of the semiconductor device 1. FIG. 1B is a schematic cross-sectional view showing a cross section along line A-A shown in FIG. 1A.

The semiconductor device 1 is, for example, an IGBT (Insulated Gate Bipolar Transistor). The embodiment is not limited thereto; and the semiconductor device 1 may be a MOSFET or a diode.

The semiconductor device 1 includes a semiconductor body 10, a collector electrode 20 (a first electrode), an emitter electrode 30 (a second electrode), an EQPR electrode 40 (Equipotential Ring: a third electrode), and a gate electrode 50. The collector electrode 20 is provided on the back surface of the semiconductor body 10. The emitter electrode 30 and the EQPR electrode 40 are provided on the front surface of the semiconductor body 10. The emitter electrode 30 and the EQPR electrode 40 include, for example, the same metal material.

As shown in FIG. 1A, the EQPR electrode 40 is provided to surround the emitter electrode 30. The EQPR electrode 40 is provided to be spaced from the emitter electrode 30. For example, the emitter electrode 30 has a quadrilateral configuration when viewed from above. For example, the outer edge of the emitter electrode 30 is circular arc-shaped at the four corners.

As shown in FIG. 1B, the gate electrode 50 is disposed between the semiconductor body 10 and the emitter electrode 30. The gate electrode 50 is disposed inside a gate trench GT provided on the front surface side of the semiconductor body 10. The gate electrode 50 is electrically insulated from the semiconductor body 10 by a gate insulating film 51. Also, the gate electrode 50 is electrically insulated from the emitter electrode 30 by an inter-layer insulating film 53. The gate electrode 50 is electrically connected to a gate pad (not-illustrated). Although not illustrated in FIG. 1A, the gate pad may be placed on the front surface of the semiconductor body 10 such as being positioned inside the emitter electrode 30, and being electrically insulated from the emitter electrode 30.

The semiconductor body 10 includes an $n^-$-type drift layer 11 (a first semiconductor layer), a p-type base layer 13 (a second semiconductor layer), and an $n^+$-type emitter layer 15.

The p-type base layer 13 is selectively provided between the $n^-$-type drift layer 11 and the emitter electrode 30. The p-type base layer 13 is electrically connected to the emitter electrode 30. The p-type base layer 13 is provided to oppose the gate electrode 50 via the gate insulating film 51.

The $n^+$-type emitter layer 15 is selectively provided between the p-type base layer 13 and the emitter electrode 30. The $n^+$-type emitter layer 15 is electrically connected to the emitter electrode 30. The $n^+$-type emitter layer 15 is provided so that at least a portion of the $n^+$-type emitter layer 15 opposes the gate electrode 50 via the gate insulating film 51. The $n^+$-type emitter layer 15 includes n-type impurities with a higher concentration than the concentration of n-type impurities in the $n^-$-type drift layer 11.

For example, the gate trench GT has a bottom surface positioned at a level deeper than the boundary between the $n^-$-type drift layer 11 and the p-type base layer 13. The gate electrode 50 is provided to oppose the $n^-$-type drift layer 11 via the gate insulating film 51.

The semiconductor body 10 further includes an $n^+$-type channel stopper 17 (EQPR: a third semiconductor layer), a p-type collector layer 18, and an n-type buffer layer 19.

The $n^+$-type channel stopper 17 is provided between the $n^-$-type drift layer 11 and the EQPR electrode 40. The $n^+$-type channel stopper 17 is provided at a position spaced from the p-type base layer 13. For example, the $n^+$-type channel stopper 17 is provided so as to surround the p-type base layer 13 along the edge of the semiconductor body 10 on the front surface side. The $n^+$-type channel stopper 17 includes n-type impurities with a higher concentration than the concentration of n-type impurities in the $n^-$-type drift layer 11. The EQPR electrode 40 is electrically connected to the $n^+$-type channel stopper 17.

The p-type collector layer 18 is provided between the collector electrode 20 and the $n^-$-type drift layer 11. The collector electrode 20 is electrically connected to the p-type collector layer 18. The n-type buffer layer 19 is provided between the $n^-$-type drift layer 11 and the p-type collector layer 18. The n-type buffer layer 19 includes n-type impurities with a higher concentration than the concentration of n-type impurities in the $n^-$-type drift layer 11.

As shown in FIGS. 1A and 1B, the semiconductor device 1 further includes a RFP 60 (a first film) and an inter-layer insulating film 70 (a second film).

The RFP 60 is provided to link the emitter electrode 30 and the EQPR electrode 40. The RFP 60 surrounds the emitter electrode 30. The RFP 60 is a semi-insulative film having high resistance. The RFP includes a material having a higher resistivity than the resistivity of material in the semiconductor body 10 (e.g., the $n^-$-type drift layer 11). The RFP 60 is, for example, a polysilicon film doped with oxygen. The RFP 60 may be a silicon nitride film which includes silicon atoms with a ratio higher than the stoichiometric ratio and exhibits the semi-insulative characteristics. For example, the RFP 60 has a composition including a silicon atom and at least one of an oxygen atom, a nitrogen atom, or a carbon atom. For example, the RFP 60 has a specific resistance in the range of $1\times10^7$ to $1\times10^{14}$ ohm·centimeters ($\Omega$cm).

The inter-layer insulating film 70 is provided between the semiconductor body 10 and the RFP 60 and electrically insulates the RFP 60 from the semiconductor body 10. The inter-layer insulating film 70 is, for example, a silicon oxide film. The inter-layer insulating film 70 includes, for example, a first-film-thickness portion 71 and a second-film-thickness portion 73. The first-film-thickness portion 71 has a first-film-thickness in the Z-direction; and the second-film-thickness portion 73 has a second-film-thickness in the Z-direction. The second film thickness is thicker than the first film thickness.

Multiple first-film-thickness portions 71 and multiple second-film-thickness portions 73 are arranged alternately along the direction (e.g., the X-direction) from the emitter electrode 30 toward the EQPR electrode 40. The first-film-thickness portions 71 and the second-film-thickness portions 73 each are provided to surround the emitter electrode 30. For example, the first-film-thickness portions 71 and the second-film-thickness portions 73 are provided to have circular arc-like portions along the four corners of the emitter electrode 30. The multiple first-film-thickness portions 71 have substantially the same thickness; and the multiple second-film-thickness portions 73 have the substantially same thickness. Here, "substantially the same" means that, for example, it may be regarded to act in the same manner despite differences caused by nonuniformity in the manufacturing processes. This is similar hereinbelow.

For example, the RFP 60 has a film thickness thinner than the thickness obtained by subtracting the first film thickness from the second film thickness. The RFP 60 extends along and covers the surface of the first-film-thickness portion 71 and the surface of the second-film-thickness portion 73 without gaps remaining therebetween. For example, the RFP 60 has a film thickness of 0.5 to 2 micrometers ($\mu$m) in the Z-direction.

Figure 2A:
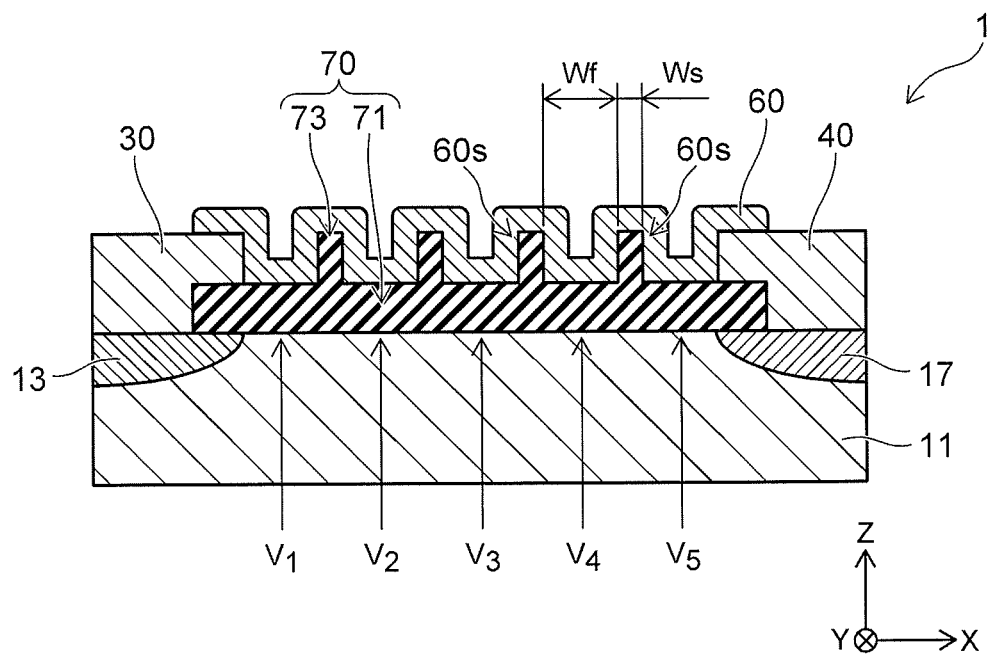
FIG. 2A is a schematic cross-sectional view showing the terminal region of the semiconductor device according to the embodiment.
Figure 2B:
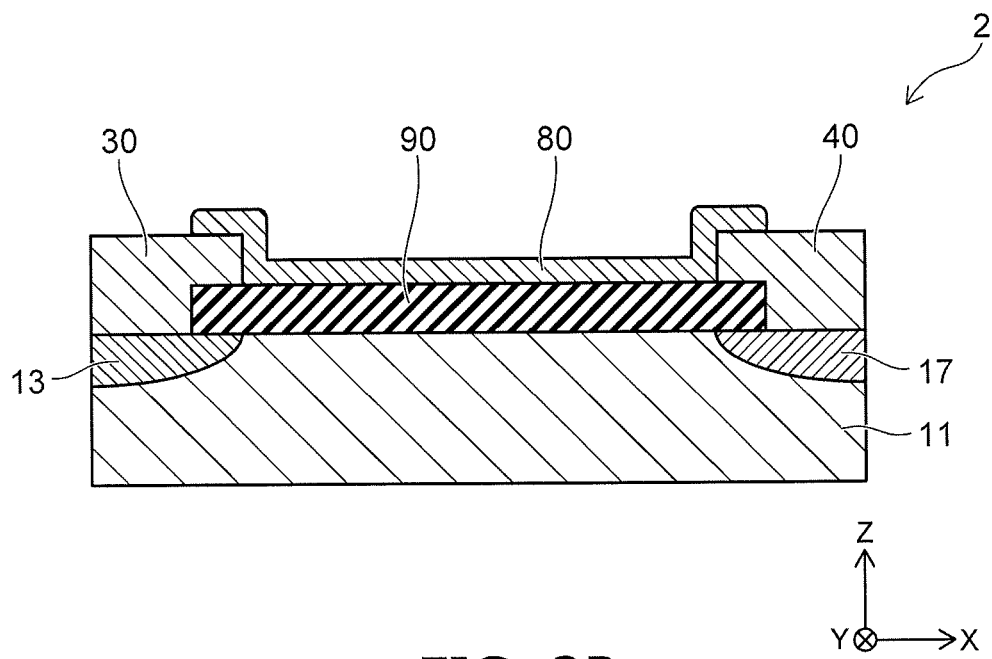
FIG. 2B is a schematic cross-sectional view showing the terminal region of a semiconductor device according to a comparative example.

FIG. 2A is a schematic cross-sectional view showing the terminal region of the semiconductor device 1 according to the embodiment. FIG. 2B is a schematic cross-sectional view showing the terminal region of a semiconductor device 2 according to a comparative example. Here, the "terminal region" is the region between the p-type base layer 13 and the $n^+$-type channel stopper 17.

As shown in FIG. 2A, the inter-layer insulating film 70 that includes the first-film-thickness portion 71 and the second-film-thickness portion 73 is provided in the terminal region of the semiconductor device 1. The RFP 60 is formed to cover the front surface of the inter-layer insulating film 70 without gaps remaining therebetween.

A RFP 80 and an inter-layer insulating film 90 are provided in the terminal region of the semiconductor device 2 shown in FIG. 2B. The inter-layer insulating film 90 has a flat front surface; and the RFP 80 covers the front surface of the inter-layer insulating film 90 without gaps. The RFP 80 has the same film thickness as the film thickness of the RFP 60.

The RFP 60 shown in FIG. 2A has the creepage distance from the emitter electrode 30 to the EQPR electrode 40 along the front surface of the inter-layer insulating film 70. As the RFP 60 covers the second-film-thickness portions 73 protruding in the Z-direction, the creepage distance of the RFP 60 is longer than the creepage distance of the RFP 80 shown in FIG. 2B. Here, the "creepage distance" is, for example, the distance from the emitter electrode 30 to the EQPR electrode 40 along the interface between the RFP 60 and the inter-layer insulating film 70.

The electrical resistance of the RFP 60 having the long creepage distance is larger than the electrical resistance of the RFP 80. Accordingly, when the electrical resistance of the RFP 60 decreases due to the heat generated in the semiconductor device 1 while operating, the resistance value can be maintained to be higher than that of the RFP 80. Thereby, it is possible to suppress the leakage current between the collector and emitter electrodes.

The first-film-thickness portion 71 has a width Wf in the horizontal direction (e.g., the X-direction) from the emitter electrode 30 toward the EQPR electrode 40. The second-film-thickness portion 73 has a width Ws in the horizontal direction. For example, the multiple first-film-thickness portions 71 that are positioned between the emitter electrode 30 and the EQPR electrode 40 each have substantially the same width Wf. Also, the multiple second-film-thickness portions 73 have substantially the same width Ws. The multiple second-film-thickness portions 73 have substantially the same horizontal direction width and are arranged at uniform spacing in the horizontal direction.

The first-film-thickness portions 71 also have the same width along the horizontal direction at the portions along the four corners of the emitter electrode 30 (referring to FIG. 1A), for example. The second-film-thickness portions 73 have the width Ws along the horizontal direction and, for example, are arranged uniformly with the same spacing along the horizontal direction at the portions along the four corners of the emitter electrode 30.

While the semiconductor device 1 is turned off in the switching operation thereof, for example, a collector-emitter voltage $V_{CE}$ is applied between the emitter electrode 30 and the EQPR electrode 40. The interface potentials induced between the n$^-$-type drift layer 11 and the first-film-thickness portions 71 are, for example, $V_1$ to $V_5$. Here, the interface potentials $V_1$ to $V_5$ are the potentials positioned at the interface between the n$^-$-type drift layer 11 and the first-film-thickness portions 71. The interface potentials $V_1$ to $V_5$ are positioned respectively directly under the center of each first-film-thickness portion 71 in the horizontal direction.

The potential distribution has the relationship $V_1 < V_2 < V_3 < V_4 < V_5$. For example, the interface potential $V_3$ is $V_{CE}/2$ at the center position between the p-type base layer 13 and the n$^+$-type channel stopper 17. That is, the RFP 60 has the electric potential distribution between the emitter electrode 30 and the EQPR electrode 40, in which the electric potential is $V_{CE}/2$ at the center of the creepage distance along the front surface of the inter-layer insulating film 70.

The electric potential at the interface between the n$^-$-type drift layer 11 and the inter-layer insulating film 70 changes according to the arrangement of the first-film-thickness portions 71 and the second-film-thickness portions 73. In the electrical potential distribution along the interface, the distance of equipotential surfaces between the n$^-$-type drift layer 11 and the second-film-thickness portions 73 is different from the distance of equipotential surfaces between the n$^-$-type drift layer and the first-film-thickness portions 71. That is, the change rate of the electric potential along the interface varies alternately according to the arrangement of the first-film-thickness portions 71 and the second-film-thickness portions 73.

Figure 3:
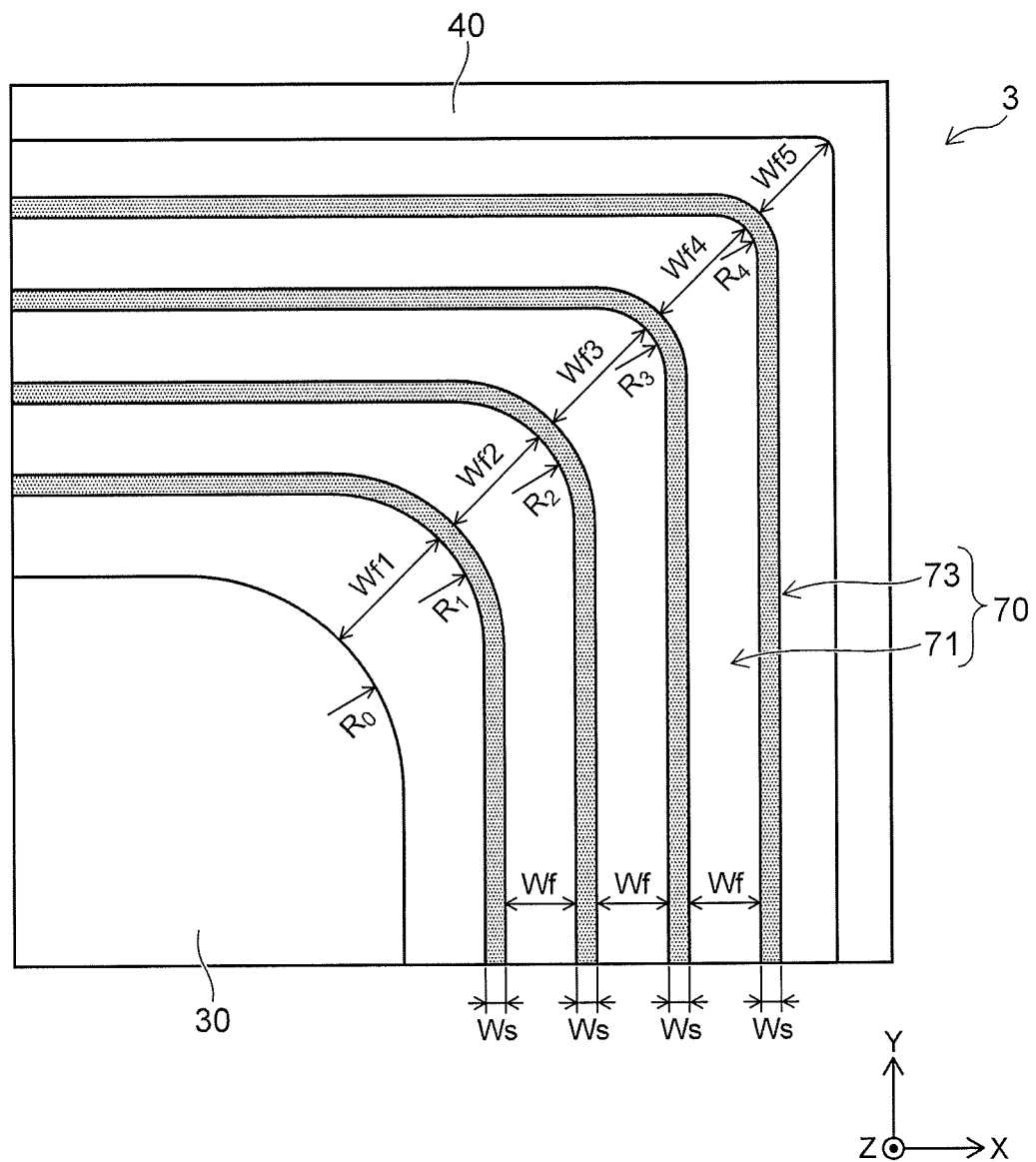
FIG. 3 is a schematic view showing a semiconductor device according to a first modification of the embodiment.

FIG. 3 is a schematic view showing a semiconductor device 3 according to a first modification of the embodiment. FIG. 3 is a schematic plan view illustrating the configuration of the terminal region between one of the corners in the emitter electrode 30 and the corner of the EQPR electrode 40 opposing the one corner of the emitter electrode 30. In FIG. 3, the RFP 60 is not illustrated; and the front surface of the inter-layer insulating film 70 is illustrated, which includes the first-film-thickness portions 71 and the second-film-thickness portions 73.

For example, the first-film-thickness portion 71 and the second-film-thickness portion 73 respectively have substantially the same widths Wf and Ws in the X-direction and the Y-direction. For example, at the corner portion in the terminal region, the second-film-thickness portions 73 are provided to have curvature radii $R_1$ to $R_4$. For example, the curvature radii $R_1$ to $R_4$ are smaller than the curvature radius $R_0$ at the corner of the emitter electrode 30. Thus, the creepage distance between the one corner of the emitter electrode 30 and the corner of the EQPR electrode 40 is longer than the creepage distances along the X-direction and the Y-direction between the emitter electrode 30 and the EQPR electrode 40. Accordingly, the electrical resistance of the RFP 60 at the corner portion in the terminal region is larger than the electrical resistance of the RFP 60 in the other portions of the terminal region. Thereby, it is possible to further suppress the leakage current between the collector-emitter electrodes.

The second-film-thickness portions 73 may be formed so that the curvature radii $R_0$ to $R_4$ have the relationship $R_0 > R_1 > R_2 > R_3 > R_4$. Thereby, the inter-layer insulating film 70 can be provided so that widths Wf1 to Wf5 of the first-film-thickness portions 71 are Wf1 > Wf2 > Wf3 > Wf4 > Wf5 along the direction from the one corner of the emitter electrode 30 toward the corner of the EQPR electrode 40.

At the corner portion of the terminal region having such a configuration, the electrical resistance of the RFP 60 becomes larger in the portion proximal to the EQPR electrode 40; and the voltage drop in the portion proximal to the EQPR becomes larger while turning off the semiconductor device 1. Accordingly, compared to the other portions of the terminal region, the potentials at the interface between the n$^-$-type drift layer 11 and the inter-layer insulating film 70 has a distribution in which high potential is shifted toward the EQPR electrode 40 (i.e., the n$^+$-type channel stopper 17 side). For example, the potential $V_{CE}/2$ is induced at a position shifted toward the EQPR electrode 40 from the center position between the one corner of the emitter electrode 30 and the corner of the EQPR electrode 40. Accordingly, while the semiconductor device 1 is turned off, the spreading of the depletion layer is enhanced at the corner portions of the terminal region; and it is possible to prevent the electric field at the p-n junction from concentrating at the portions that correspond to the corners of the emitter electrode 30. In other words, the p-n junction between the n$^-$-type drift layer 11 and the p-type base layer 13 may have higher breakdown voltage.

Figure 4A:
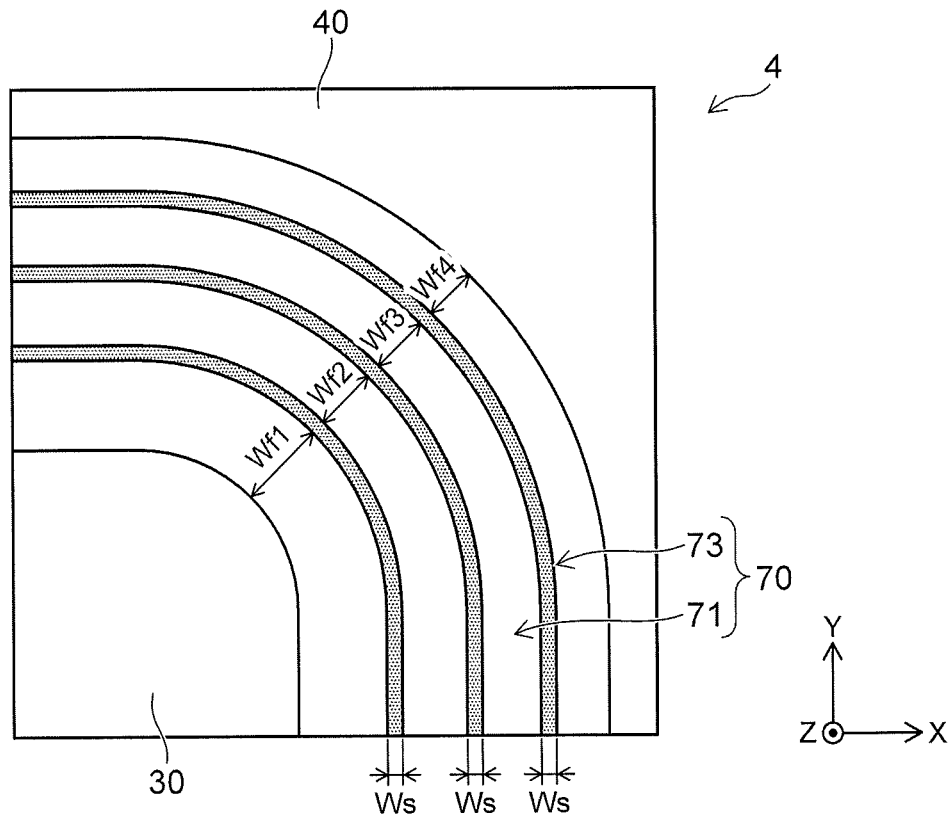
FIGS. 4A and 4B are schematic views showing a semiconductor device according to a second modification of the embodiment.
Figure 4B:
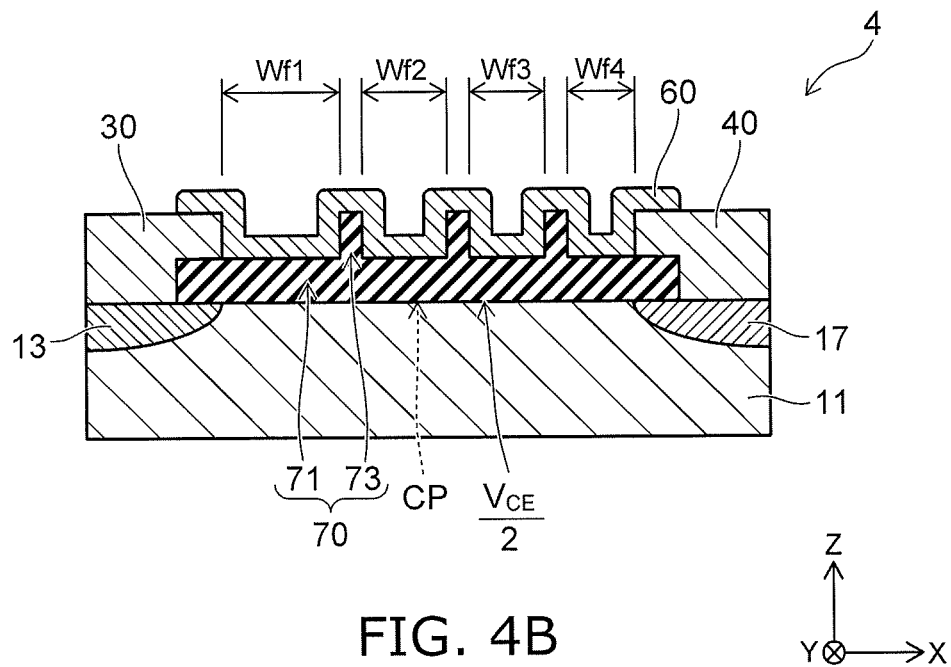

FIGS. 4A and 4B are schematic views showing a semiconductor device 4 according to a second modification of the embodiment. FIG. 4A is a schematic plan view illustrating the configuration of the terminal region between one of four corners of the emitter electrode 30 and the corner of the EQPR electrode 40 opposing the one corner of the emitter electrode 30. In FIG. 4A, the RFP 60 is not illustrated; and the front surface of the inter-layer insulating film 70 is illustrated, which includes the first-film-thickness portions 71 and the second-film-thickness portions 73. FIG. 4B is a schematic cross-sectional view showing a cross section corresponding to FIG. 1B.

The inter-layer insulating film 70 of the semiconductor device 4 also includes the first-film-thickness portions 71 and the second-film-thickness portions 73. The second-film-thickness portions 73 have substantially the same width Ws along the horizontal direction from the emitter electrode 30 toward the EQPR electrode 40. In other words, the second-film-thickness portions 73 have substantially the same width Ws along each of the X-direction, the Y-direction, and the direction from the one corner of the emitter electrode 30 toward the corner of the EQPR electrode 40. The first-film-thickness portions 71 respectively have the widths Wf1, Wf2, Wf3, and Wf4 in the horizontal direction from the emitter electrode 30 side. In the example, the inter-layer insulating film 70 is provided to have the relationship Wf1>Wf2>Wf3>Wf4.

When the semiconductor device 4 is turned off as shown in FIG. 4B, the potentials at the interface between the n⁻-type drift layer 11 and the inter-layer insulating film 70 have a distribution in which high potential is shifted toward the n⁺-type channel stopper 17. In other words, the potential $V_{CE}/2$ is induced at a position shifted toward the n⁺-type channel stopper 17 from the center position CP between the p-type base layer 13 and the n⁺-type channel stopper 17. Thereby, the spreading of the depletion layer is enhanced in the terminal region; and the breakdown voltage of the p-n junction may be higher between the n⁻-type drift layer 11 and the p-type base layer 13. In the example, the breakdown voltage of the p-n junction becomes higher in the entire terminal region.

Further, as shown in FIG. 3, the curvature radii of the second-film-thickness portions 73 can be set to be smaller than the curvature radius $R_0$ of the corner of the emitter electrode 30 at the corner portion of the terminal region. Thereby, it is possible to make the electrical resistance of the RFP 60 higher; and the breakdown voltage of the p-n junction becomes higher at a portion corresponding to the corner of the emitter electrode 30.

Figure 5A:
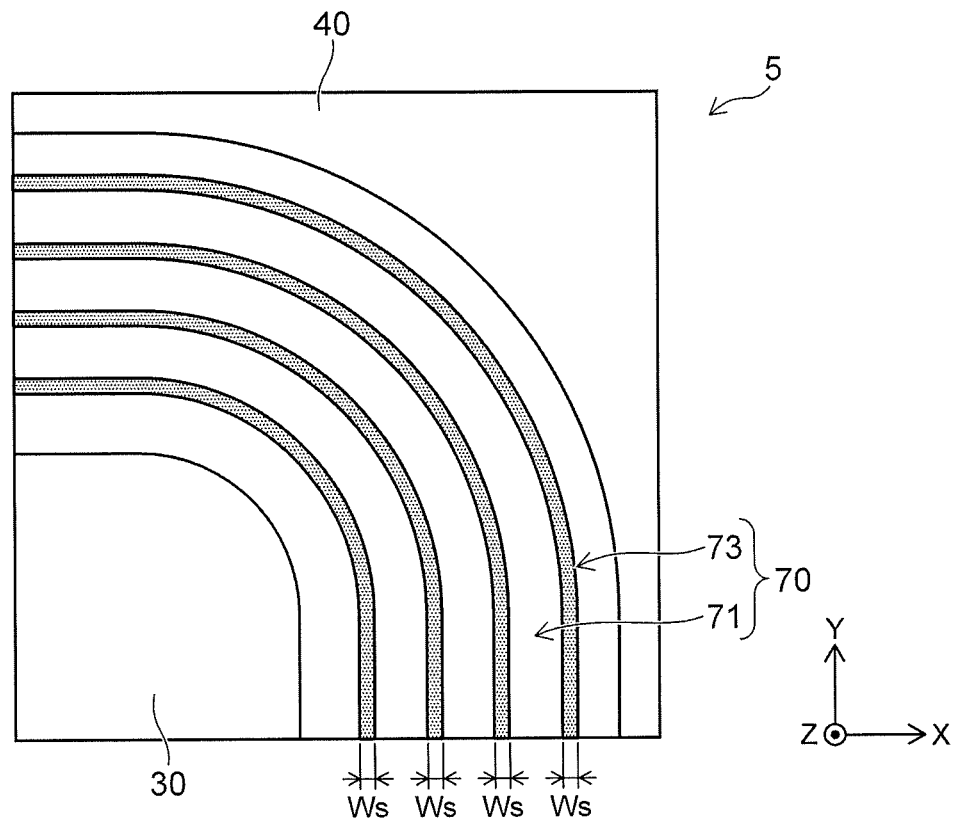
FIGS. 5A and 5B are schematic views showing a semiconductor device according to a third modification of the embodiment.
Figure 5B:
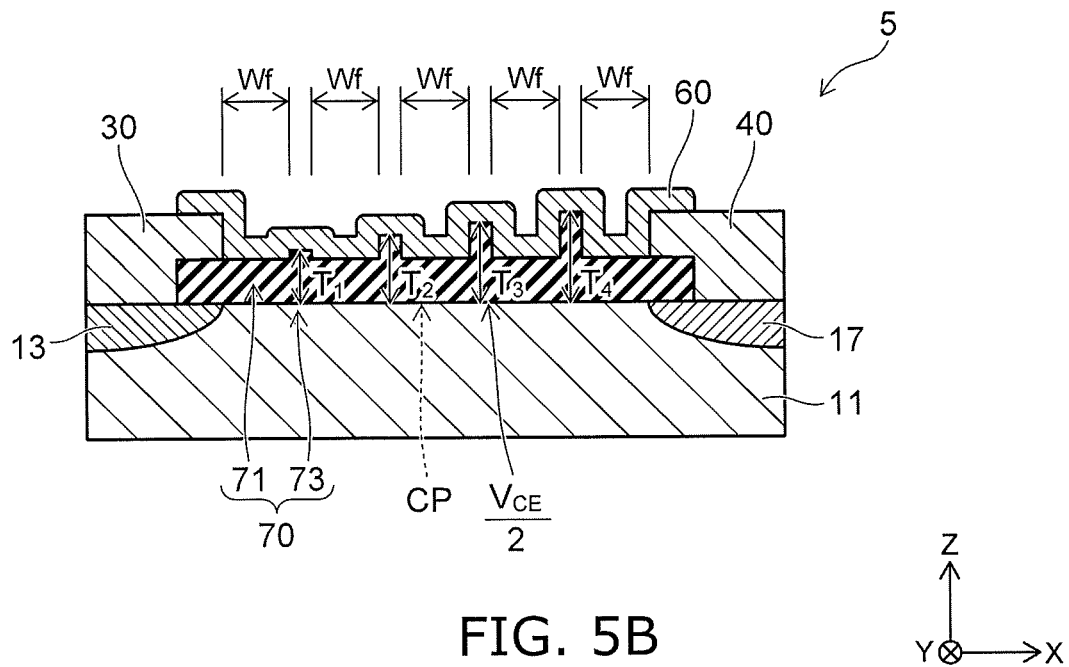

FIGS. 5A and 5B are schematic views showing a semiconductor device 5 according to a third modification of the embodiment. FIG. 5A is a schematic plan view illustrating the configuration of the terminal region between one of four corners of the emitter electrode 30 and the corner of the EQPR electrode 40 opposing the one corner of the emitter electrode 30. In FIG. 5A, the RFP 60 is not illustrated; and the front surface of the inter-layer insulating film 70 is illustrated, which includes the first-film-thickness portions 71 and the second-film-thickness portions 73. FIG. 5B is a schematic cross-sectional view showing a cross section corresponding to FIG. 1B.

The first-film-thickness portions 71 have the width Wf in the horizontal direction from the emitter electrode 30 toward the EQPR electrode 40. The second-film-thickness portions 73 have the width Ws along the horizontal direction. For example, the multiple first-film-thickness portions 71 are positioned between the emitter electrode 30 and the EQPR electrode 40, and each have substantially the same width Wf. The multiple second-film-thickness portions 73 also have substantially the same width Ws.

The multiple first-film-thickness portions 71 have substantially the same film thickness along the Z-direction. The second-film-thickness portions 73 each have, for example, the film thicknesses $T_1$, $T_2$, $T_3$, and $T_4$ along the Z-direction, which are arranged in order from the emitter electrode 30. The second-film-thickness portions 73 are provided to become thicker from the emitter electrode 30 toward the EQPR electrode 40 ($T_1<T_2<T_3<T_4$). For example, the RFP 60 has a film thickness that is thinner than the thickness obtained by subtracting the film thickness along the Z-direction of the first-film-thickness portion 71 from the maximum film thickness ($T_4$) along the Z-direction of the second-film-thickness portion 73.

In the example as well, the RFP 60 has the electrical resistance higher than the case where the second-film-thickness portions 73 are not provided (referring to FIG. 2B). The partial electrical resistance of the RFP 60 between the portions positioned on the adjacent first-film-thickness portions 71 increases toward the EQPR electrode 40. For example, the voltage difference between the first-film-thickness portions 71 adjacent in the horizontal direction increases toward the EQPR electrode 40. In the potential distribution at the interface between the n⁻-type drift layer 11 and the inter-layer insulating film 70, higher potential is shifted toward the EQPR electrode 40. In other words, the potential $V_{CE}/2$ is induced at the position shifted toward the EQPR electrode 40 from the center position CP between the p-type base layer 13 and the n⁺-type channel stopper 17. Thereby, while the semiconductor device 5 is turned off, the leakage current is suppressed between the collector-emitter electrodes; and the spreading of the depletion layer is enhanced in the terminal region, thus, making the breakdown voltage of the p-n junction higher.

In the example as well, it is possible to use the arrangement at the corner portion of the terminal region shown in FIG. 3. Thereby, it is possible to increase the electrical resistance of the RFP 60, thus, making the breakdown voltage of the p-n junction further higher at the corner portion.

Figure 6A:
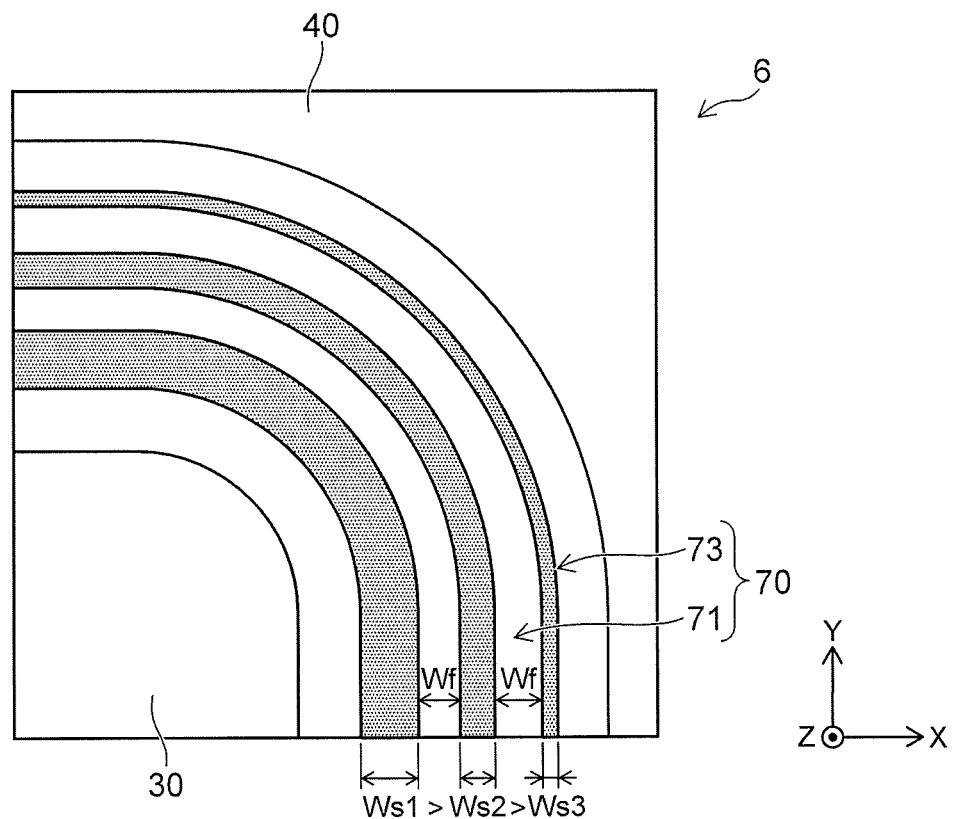
FIGS. 6A and 6B are schematic views showing a semiconductor device according to a fourth modification of the embodiment.
Figure 6B:
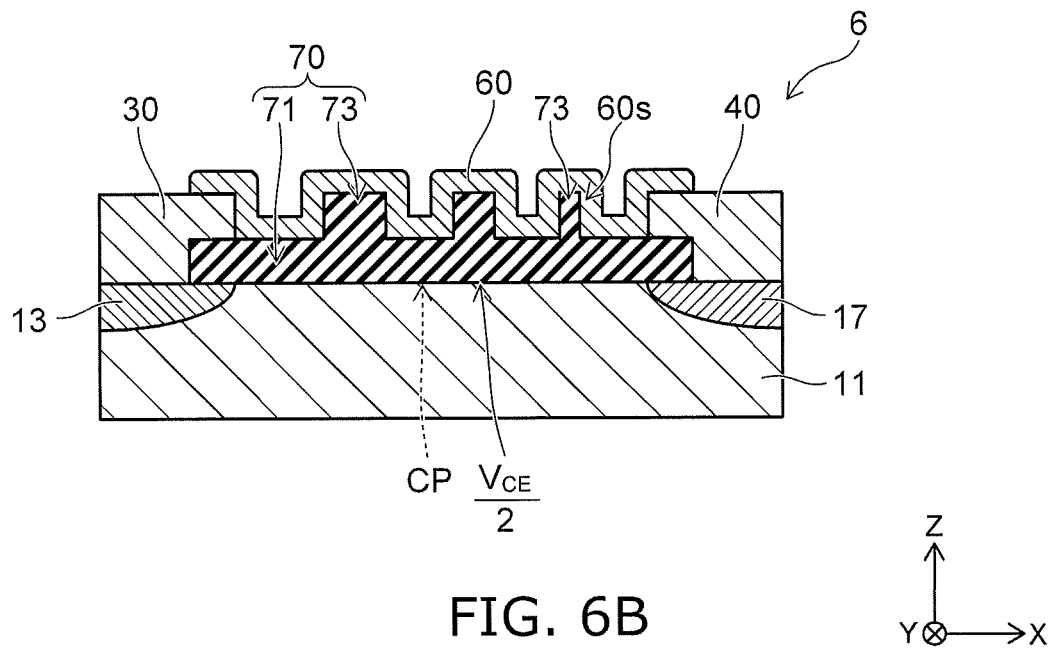

FIGS. 6A and 6B are schematic views showing a semiconductor device 6 according to a fourth modification of the embodiment. FIG. 6A is a schematic plan view illustrating the configuration of the terminal region between one of four corners of the emitter electrode 30 and the corner of the EQPR electrode 40 opposing the one corner of the emitter electrode 30. In FIG. 6A, the RFP 60 is not illustrated; and the front surface of the inter-layer insulating film 70 is illustrated, which includes the first-film-thickness portions 71 and the second-film-thickness portions 73. FIG. 6B is a schematic cross-sectional view showing a cross section corresponding to FIG. 1B.

The first-film-thickness portions 71 have the width Wf along the horizontal direction directed from the emitter electrode 30 toward the EQPR electrode 40. For example, the multiple first-film-thickness portions 71 are positioned between the emitter electrode 30 and the EQPR electrode 40, and each have substantially the same width Wf.

The multiple second-film-thickness portions 73 each have widths Ws1, Ws2, and Ws3 along the Z-direction. The second-film-thickness portions 73 are provided so that the width Ws becomes narrow in the horizontal direction from the emitter electrode 30 toward the EQPR electrode 40 (Ws1>Ws2>Ws3).

For example, the multiple first-film-thickness portions 71 are provided to have substantially the same film thickness along the Z-direction. For example, the multiple second-film-thickness portions 73 are provided to have substantially the same film thickness along the Z-direction.

In the example as well, the RFP 60 has the electrical resistance higher than the case where the second-film-thickness portions 73 are not provided (referring to FIG. 2B). The RFP 60 includes the portions 60s that cover the side surfaces of the second-film-thickness portions 73. The density of the portions 60s increases toward the EQPR electrode 40. Therefore, the potential distribution inside the RFP 60 changes in the horizontal direction. The change amount of potential is greater toward the EQPR electrode 40. That is, in the potential distribution at the interface between the n⁻-type drift layer 11 and the inter-layer insulating film 70, higher potential is shifted toward the EQPR electrode 40. For example, the potential $V_{CE}/2$ is induced at the position shifted toward the EQPR electrode 40 from the center position CP between the p-type base layer 13 and the n⁺-type channel stopper 17. Thereby, while the semiconductor device 6 is turned off, the leakage current is suppressed between the collector-emitter electrodes; and the spreading of the depletion layer is enhanced in the terminal region, thus, making the breakdown voltage of the p-n junction higher.

In the example as well, it is possible to use the arrangement at the corner portion of the terminal region shown in FIG. 3; and the electrical resistance of the RFP 60 can be increased, thus, making the breakdown voltage of the p-n junction further higher at the corner portion.

Figure 7A:
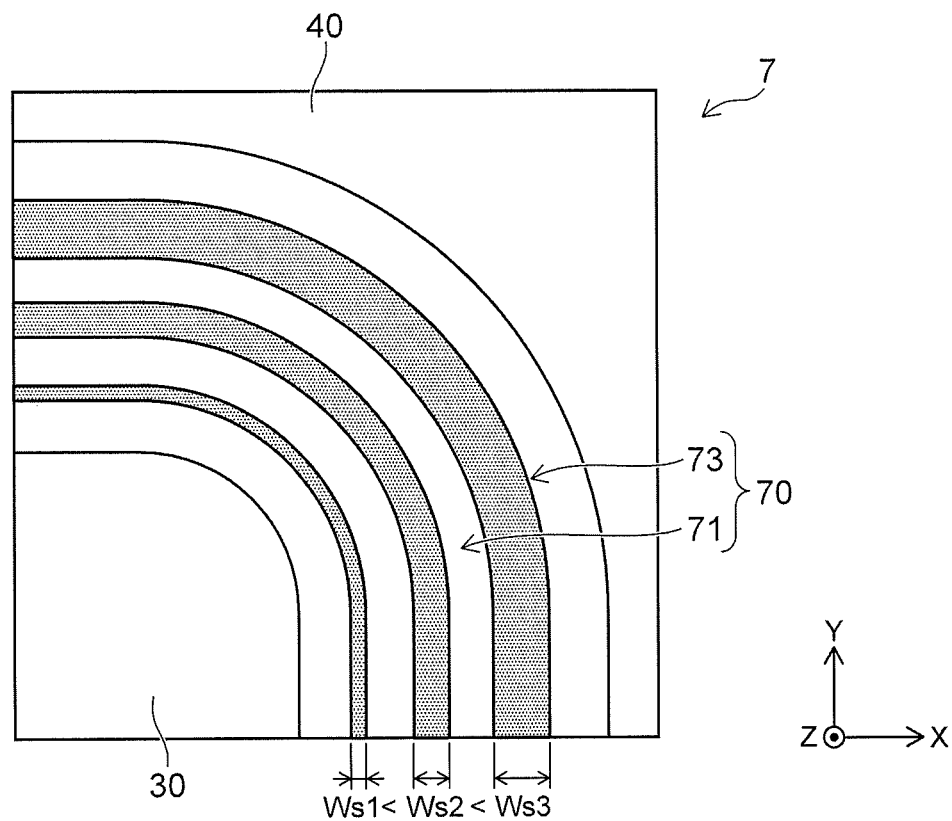
FIGS. 7A and 7B are schematic views showing a semiconductor device according to a fifth modification of the embodiment.
Figure 7B:
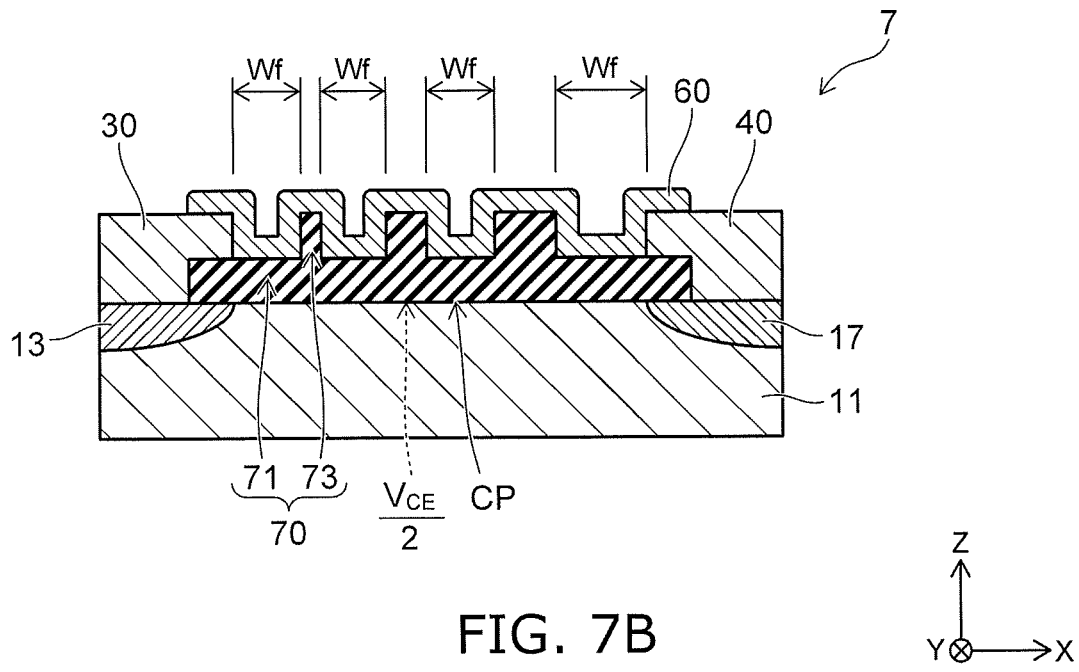

FIGS. 7A and 7B are schematic views showing a semiconductor device 7 according to a fifth modification of the embodiment. FIG. 7A is a schematic plan view illustrating the configuration of the terminal region between one of four corners of the emitter electrode 30 and the corner of the EQPR electrode 40 opposing the one corner of the emitter electrode 30. In FIG. 7A, the RFP 60 is not illustrated; and the front surface of the inter-layer insulating film 70 is illustrated, which includes the first-film-thickness portions 71 and the second-film-thickness portions 73. FIG. 7B is a schematic cross-sectional view showing a cross section corresponding to FIG. 1B.

The first-film-thickness portions 71 have the width Wf along the horizontal direction directed from the emitter electrode 30 toward the EQPR electrode 40. For example, the multiple first-film-thickness portions 71 are positioned between the emitter electrode 30 and the EQPR electrode 40, and each have substantially the same width Wf.

The multiple second-film-thickness portions 73 each have the widths Ws1, Ws2, and Ws3 in the horizontal direction, which are arranged in order from the emitter electrode 30 side. The second-film-thickness portions 73 are provided so that the width Ws widens in the horizontal direction from the emitter electrode 30 toward the EQPR electrode 40 (Ws1<Ws2<Ws3).

For example, the multiple first-film-thickness portions 71 are provided to have substantially the same film thickness along the Z-direction. The second-film-thickness portions 73, for example, are provided to have substantially the same film thickness along the Z-direction.

In the example as well, the RFP 60 has the electrical resistance higher than the case where the second-film-thickness portion 73 is not provided (referring to FIG. 2B). The RFP 60 has the portions 60s covering the side surfaces of the second-film-thickness portions 73, and the density of the portions 60 is higher toward the emitter electrode 30. Therefore, the potential distribution inside the RFP 60 changes in the horizontal direction, and the change amount of potential is greater toward the emitter electrode 30. That is, in the potential distribution at the interface between the n⁻-type drift layer 11 and the inter-layer insulating film 70, higher potential is shifted toward the emitter electrode 30. For example, the potential $V_{CE}/2$ is induced at the position shifted toward the emitter electrode 30 from the center position CP between the p-type base layer 13 and the n⁺-type channel stopper 17. Thereby, while the semiconductor device 7 is turned off, the leakage current is suppressed between the collector-emitter electrodes; and the spreading of the depletion layer is suppressed in the terminal region. Such a configuration is effective, for example, in the case where the spreading of the depletion layer is enhanced due to the external ions, and the depletion layer easily reaches the n⁺-type channel stopper 17. By this configuration, it is possible to suppress the spreading of the depletion layer without decreasing the breakdown voltage in the terminal portion.

As described above, it is possible to provide various distributions of the electric potential along the interface between the n⁻-type drift layer 11 and the inter-layer insulating film 70 by changing the arrangement of the first-film-thickness portions 71 and the second-film-thickness portions 73 and appropriately control the spreading of the depletion layer in the terminal portion. For example, it is possible to reverse the arrangement of the second-film-thickness portions 73 in the semiconductor device 4 shown in FIGS. 4A and 4B and in the semiconductor device 5 shown in FIGS. 5A and 5B. That is, in FIGS. 4A and 4B, the second-film-thickness portions 73 may be arranged to have the relationship of widths such as Wf1<Wf2<Wf3<Wf4. Also, in FIGS. 5A and 5B, the second-film-thickness portions 73 may be provided to have the relationship of thicknesses such as $T_1>T_2>T_3>T_4$.

Figure 8:
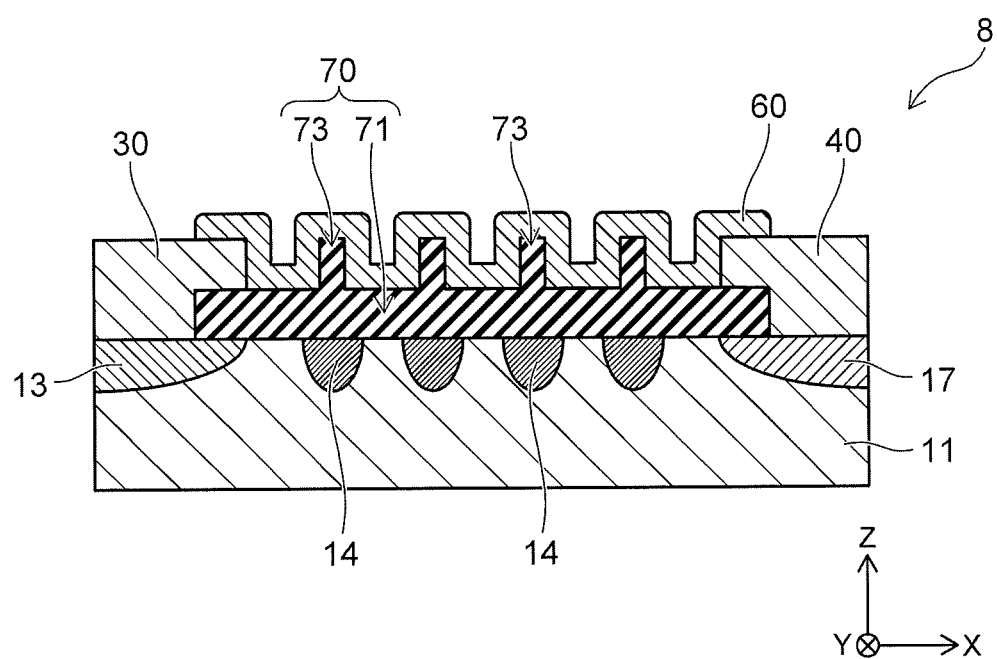
FIG. 8 is a schematic view showing a semiconductor device according to a sixth modification of the embodiment.

FIG. 8 is a schematic view showing a semiconductor device 8 according to a sixth modification of the embodiment. FIG. 8 is a schematic cross-sectional view showing a cross section corresponding to FIG. 1B.

In the semiconductor device 8, p-type guard ring layers are provided directly under the second-film-thickness portions 73 of the inter-layer insulating film 70. The p-type guard ring layers 14 are provided inside the n⁻-type drift layer 11 and disposed to surround the p-type base layer 13 when viewed along the Z-direction. Thereby, the spreading of the depletion layer can be enhanced in the terminal portion, thus, making the breakdown voltage higher at the p-n junction between the n⁻-type drift layer 11 and the p-type base layer 13.

Thus, in the semiconductor device according to the embodiment, by providing the inter-layer insulating film 70 including the first-film-thickness portions 71 and the second-film-thickness portions 73, the electrical resistance of the RFP 60 can be higher; and the leakage current can be suppressed between the collector-emitter electrodes. Further, by changing the sizes of the first-film-thickness portions 71 and the second-film-thickness portions 73, the potential distribution can be controlled in the terminal region.

The first-film-thickness portions 71 and the second-film-thickness portions 73 shown in the embodiments recited above are not uniquely configured for each example and are mutually applicable within the extent of technical feasibility. For example, the configuration shown in FIG. 5B also is applicable to the examples shown in FIGS. 4A and 4B and FIGS. 6A and 6B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor body including a first semiconductor layer of a first conductivity type;
a first electrode provided on a back surface of the semiconductor body;
a second electrode provided on a front surface of the semiconductor body;
a third electrode provided on the front surface of the semiconductor body at a position spaced from the second electrode;
a first film linking the second electrode and the third electrode, the first film including a material having a higher resistivity than a material of the first semiconductor layer; and
a second film provided between the semiconductor body and the first film, the second film being insulative,
the semiconductor body further including a second semiconductor layer of a second conductivity type and a third semiconductor layer of the first conductivity type, the second semiconductor layer being selectively provided between the second electrode and the first semiconductor layer, the third semiconductor layer being selectively provided between the third electrode and the first semiconductor layer, the third semiconductor layer including first-conductivity-type impurities having a higher concentration than a concentration of first-conductivity-type impurities in the first semiconductor layer,
the second film including a first-film-thickness portion and a second-film-thickness portion, the first-film-thickness portion having a first film thickness along a first direction directed from the first electrode toward the second electrode, the second-film-thickness portion having a second film thickness along the first direction thicker than the first film thickness, the first-film-thickness portion and the second-film-thickness portion surrounding the second electrode,
the first film extending along surfaces of the first-film-thickness portion and the second-film-thickness portion, the first film having a film thickness thinner than a thickness obtained by subtracting the first film thickness from the second film thickness.

2. The device according to claim 1, wherein the first film includes a silicon atom and at least one of an oxygen atom, a nitrogen atom, or a carbon atom, the first film having a specific resistance in a range of $1 \times 10^7$ to $1 \times 10^{14}$ ohm·centimeters, and having a film thickness of 0.5 to 2 micrometers along the first direction.

3. The device according to claim 1, wherein the semiconductor body further includes a fourth semiconductor layer of the second conductivity type, the fourth semiconductor layer being positioned between the second semiconductor layer and the third semiconductor layer, the fourth semiconductor layer being positioned beneath the second-film-thickness portion, the fourth semiconductor layer being provided to surround the second semiconductor layer.

4. The device according to claim 3, wherein
the first-film-thickness portion, the second-film-thickness portion and the fourth semiconductor region are provided respectively in a plurality, and
the plurality of fourth semiconductor layers are positioned beneath the plurality of second-thickness-portions, respectively.

5. The device according to claim 1, wherein
the first-film-thickness portion and the second-film-thickness portion are provided respectively in a plurality, and
the plurality of the first-film-thickness portions and the plurality of the second-film-thickness portions are arranged alternately along a second direction directed from the second electrode toward the third electrode.

6. The device according to claim 5, wherein
the plurality of second-film-thickness portions include a first portion and a second portion, the second portion being positioned closer to the third electrode than the first portion, the first portion having a first thickness along the first direction, the second portion having a second thickness along the first direction, the second thickness being larger than the first thickness.

7. The device according to claim 5, wherein
the plurality of second-film-thickness portions include a first portion and a second portion, the second portion being positioned closer to the third electrode than the first portion, the first portion having a first width along the second direction, the second portion having a second width along the second direction, the second width being narrower than the first width.

8. The device according to claim 5, wherein
the plurality of second-film-thickness portions include a first portion and a second portion, the second portion being positioned closer to the third electrode than the first portion, the first portion having a first width along the second direction, the second portion having a second width along the second direction, the second width being wider than the first width.

9. The device according to claim 5, wherein the plurality of first-film-thickness portions have the same width along the second direction.

10. The device according to claim 5, wherein
the second electrode has a planar configuration along the front surface of the semiconductor body, the planar configuration including a plurality of corners, the plurality of second-film-thickness portions each having curvature radius corresponding to one of the plurality of corners.

11. The device according to claim 10, wherein
the plurality of second-film-thickness portions include a first portion and a second portion, the second portion being positioned closer to the third electrode than the first portion, the first portion having a first curvature radius, the second portion having a second curvature radius smaller than the first curvature radius.

* * * * *